United States Patent
Chen et al.

(10) Patent No.: US 9,190,446 B1
(45) Date of Patent: Nov. 17, 2015

(54) SENSING APPARATUS

(71) Applicant: Au Optronics Corporation, Hsinchu (TW)

(72) Inventors: Tsung-Han Chen, New Taipei (TW); Chin-Mao Lin, Miaoli County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/551,091

(22) Filed: Nov. 24, 2014

(30) Foreign Application Priority Data

Jun. 27, 2014 (TW) .............................. 103122336 A

(51) Int. Cl.
| | |
|---|---|
| *H01L 27/146* | (2006.01) |
| *H01L 29/786* | (2006.01) |
| *H01L 31/028* | (2006.01) |
| *H01L 31/0376* | (2006.01) |
| *H01L 31/105* | (2006.01) |
| *H01L 31/0224* | (2006.01) |

(52) U.S. Cl.
CPC .... *H01L 27/14643* (2013.01); *H01L 27/14616* (2013.01); *H01L 27/14636* (2013.01); *H01L 29/78669* (2013.01); *H01L 31/028* (2013.01); *H01L 31/022408* (2013.01); *H01L 31/03762* (2013.01); *H01L 31/1055* (2013.01)

(58) Field of Classification Search
CPC ...................... H01L 27/14643; H01L 27/1461; H01L 27/14636; H01L 31/028; H01L 31/1055; H01L 31/022408; H01L 31/03762; H01L 29/78669

See application file for complete search history.

(56) References Cited

U.S. PATENT DOCUMENTS

| | | |
|---|---|---|
| 2012/0329193 A1 | 12/2012 | Guo et al. |
| 2013/0001516 A1 | 1/2013 | Hebard et al. |
| 2014/0339561 A1* | 11/2014 | Yokoyama ...... H01L 31/022408 257/53 |

FOREIGN PATENT DOCUMENTS

TW 201133910 10/2011

OTHER PUBLICATIONS

Xiaohong An, et al., "Tunable Graphene-Silicon Heterojunctions for Ultrasensitive Photodetection," Nano letters, vol. 13, No. 3, Feb. 5, 2013, pp. 909-916.

* cited by examiner

*Primary Examiner* — Selim Ahmed
*Assistant Examiner* — Wasiul Haider
(74) *Attorney, Agent, or Firm* — Jianq Chyun IP Office

(57) ABSTRACT

A sensing apparatus that includes a plurality of sensing pixels is provided. The sensing pixels are arranged in an array, and each of the sensing pixels includes an active device and a sensing device. The sensing device is electrically connected to the active device, and the sensing device includes a first electrode layer, an amorphous silicon layer, a second electrode layer, and a graphene layer. The amorphous silicon layer is located on the first electrode layer. The second electrode layer is located on the amorphous silicon layer and has an opening. The graphene layer is in contact with the second electrode layer and the amorphous silicon layer.

16 Claims, 14 Drawing Sheets

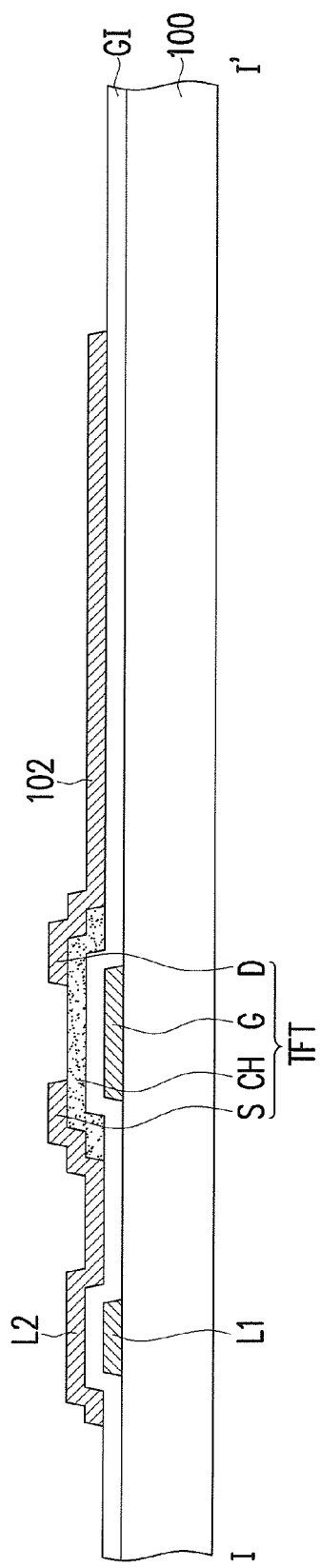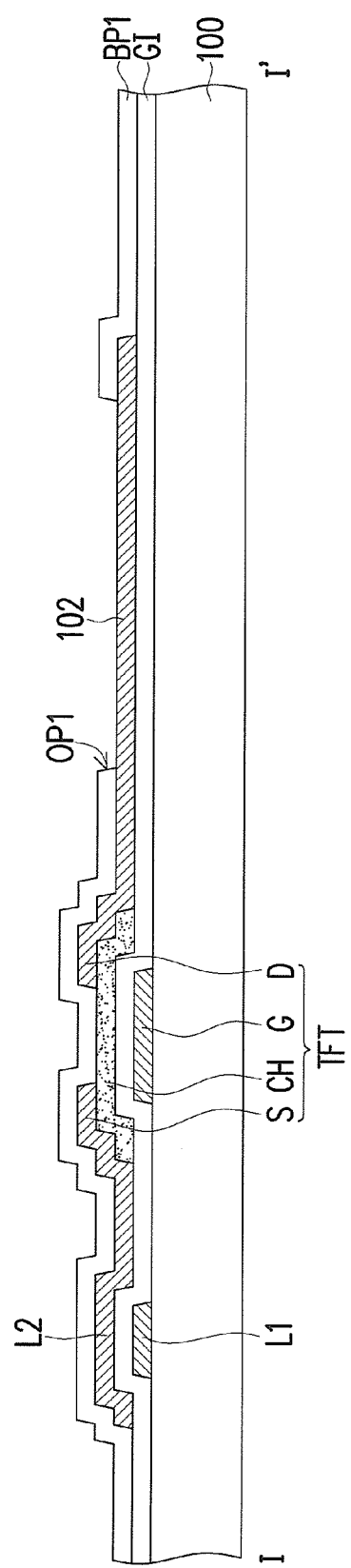
FIG. 3C
FIG. 3D

SENSING APPARATUS

CROSS-REFERENCE TO RELATED APPLICATION

This application claims the priority benefit of Taiwan application serial no. 103122336, filed on Jun. 27, 2014. The entirety of the above-mentioned patent application is hereby incorporated by reference herein and made a part of this specification.

BACKGROUND

1. Field of the Invention

The invention relates to a sensing apparatus; more particularly, the invention relates to a sensing apparatus in which a sensing device includes an amorphous silicon layer and a graphene layer.

2. Description of Related Art

In the existing image sensing array, each sensing pixel usually includes one thin film transistor (TFT) and one PIN diode. The TFT serves as a switch device performing a reading function, and the PIN diode acts as a sensing device which converts optical energy into electronic signals.

Generally, in order for the image sensing array to achieve remarkable quantum efficiency (QE), i.e., incident photon-to-electron conversion efficiency (IPCE), a PIN layer with sufficient thickness (about 1.0 μm to 1.5 μm) is often required to be deposited, and thus the protection layer that protects the PIN layer is also required to have the sufficient thickness. As a result, the conventional image sensing array not only has the large thickness but also requires significant time spent on depositing the PIN layer and high manufacturing costs. Besides, the conventional image sensing array can be completely formed by performing eleven photolithography and etching processes (PEPs) in most cases, which further complicates the manufacturing process. Hence, how to reduce the number of times of performing the PEPs for manufacturing the image sensing array and reduce the complexity of the overall manufacturing process has become one of the important research and development tasks.

SUMMARY OF THE INVENTION

The invention is directed to a sensing apparatus which is suitable for a large area fabrication, and the number of times of performing photolithography and etching processes (PEPs) for forming the sensing apparatus can be reduced.

In an embodiment of the invention, a sensing apparatus that includes a plurality of sensing pixels is provided. The sensing pixels are arranged in an array, and each of the sensing pixels includes an active device and a sensing device. The sensing device is electrically connected to the active device, and the sensing device includes a first electrode layer, an amorphous silicon layer, a second electrode layer, and a graphene layer. The amorphous silicon layer is located on the first electrode layer. The second electrode layer is located on the amorphous silicon layer and has an opening. The graphene layer is in contact with the second electrode layer and the amorphous silicon layer.

Accordingly, in the sensing apparatus described herein, the sensing device senses light through a junction constituted by the amorphous silicon layer and the graphene layer, and thereby the sensing apparatus can be suitable for the large area production. In addition, the sensing apparatus described herein may be manufactured by performing the reduced number of PEPs, such that the complexity of the overall manufacturing process and the manufacturing costs can be both reduced.

Several exemplary embodiments accompanied with figures are described in detail below to further describe the invention in details.

BRIEF DESCRIPTION OF THE DRAWINGS

FIG. 3A to FIG. 3H are cross-sectional views illustrating a method of manufacturing a sensing apparatus according to an embodiment of the invention.

DETAILED DESCRIPTION OF DISCLOSED EMBODIMENTS

Figure 1:
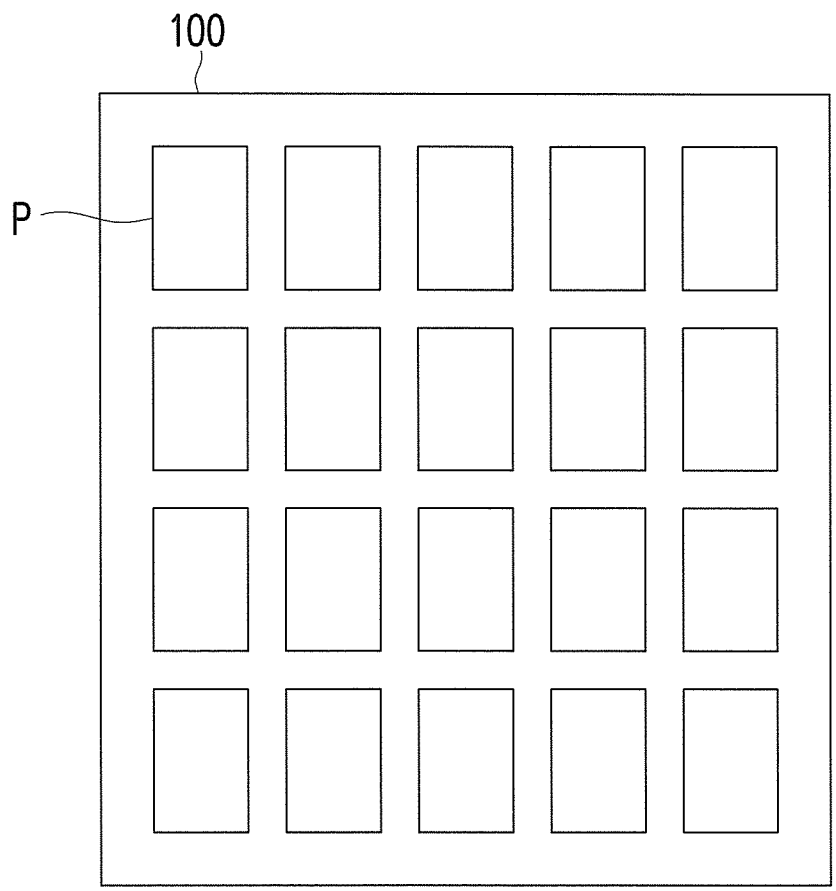
FIG. 1 is a schematic top view illustrating a sensing apparatus according to an embodiment of the invention.

FIG. 1 is a schematic top view illustrating a sensing apparatus according to an embodiment of the invention.

With reference to FIG. 1, the sensing apparatus 10 includes a substrate 100 and a plurality of sensing pixels P. The substrate 100 is made of glass, quartz, organic polymer, an opaque/reflective material (e.g., a conductive material, metal, wafer, ceramics, or any other appropriate material), or any other appropriate material. The sensing pixels P are located on the substrate 100.

The manufacturing method of the sensing apparatus 10 will be elaborated hereinafter with reference to FIG. 2A to FIG. 2H and FIG. 3A to FIG. 3H. Note that the sensing apparatus 10 includes a plurality of sensing pixels P, and the sensing pixels P are adjacent to each other and are arranged in columns and rows to form an array. However, for illustrative purposes, FIG. 2A to FIG. 2H and FIG. 3A to FIG. 3H merely show one of the sensing pixels P in the sensing apparatus 10.

FIG. 2A to FIG. 2H are top views illustrating a method of manufacturing a sensing apparatus according to an embodiment of the invention. FIG. 3A to FIG. 3H are cross-sectional views illustrating a method of manufacturing a sensing apparatus according to an embodiment of the invention. The cross-sectional location shown in FIG. 3A to FIG. 3H corresponds to the location of the sectional line I-I' depicted in FIG. 2A to FIG. 2H.

Figure 2A:
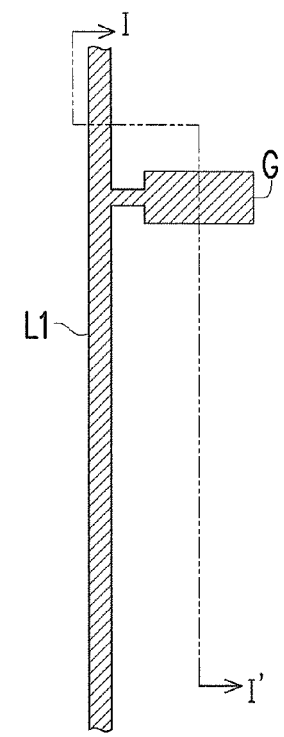
FIG. 2A to FIG. 2H are top views illustrating a method of manufacturing a sensing apparatus according to an embodiment of the invention.
Figure 3A:
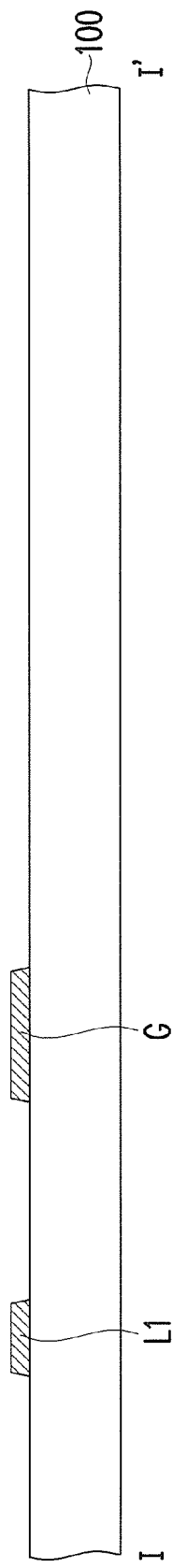

With reference to FIG. 2A and FIG. 3A, a gate G and a first signal line L1 are formed on the substrate 100, and the gate G and the first signal line L1 are electrically connected. Particularly, the gate G and the first signal line L1 can be formed by performing a first PEP. In consideration of conductivity, the gate G and the first signal line L1 are often made of metal materials. However, the invention is not limited thereto; according to other embodiments of the invention, the gate G and the first signal line L1 may be made of conductive materials other than metal materials, such as alloy, metal oxide, metal nitride, metal oxynitride, or a stacked layer of metal and other conductive materials. In the present embodiment, the gate G and the first signal line L1 belong to the same film layer. That is, the gate G and the first signal line L1 are constituted by the same metal layer.

Figure 2B:
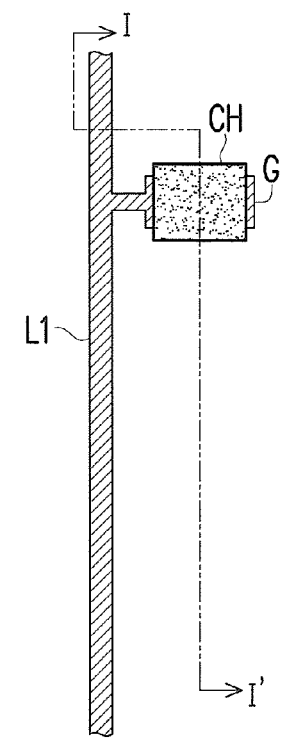
Figure 3B:
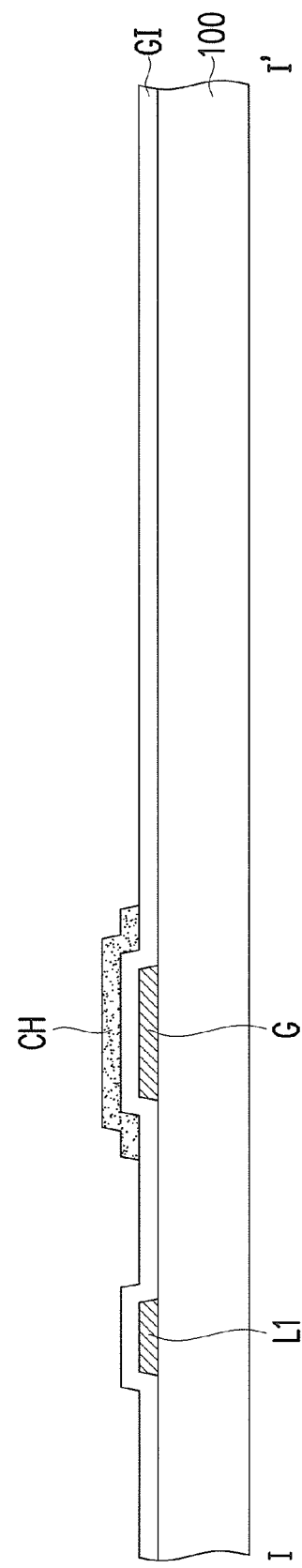

With reference to FIG. 2B and FIG. 3B, a gate insulation layer GI is formed on the substrate 100, and the gate insulation layer GI covers the gate G and the first signal line L1. The gate insulation layer GI can be comprehensively deposited onto the substrate 100 through physical vapor deposition (PVD) or chemical vapor deposition (CVD). For instance, the gate insulating layer GI is made of inorganic materials, such as silicon oxide (SiOx), silicon nitride (SiNx), silicon oxynitride, etc. For illustrative purposes, the gate insulation layer GI is not depicted in FIG. 2B.

A channel layer CH is formed on the gate insulation layer GI, and the channel layer CH and the gate G are at least partially overlapped in a vertical projection direction. In the present embodiment, the channel layer CH is located above the gate G and covers the gate G. In particular, the channel layer CH can be formed by performing a second PEP. According to the present embodiment, the channel layer CH is made of an amorphous silicon semiconductor material.

After the channel layer CH is formed on the gate insulation layer GI, the method of manufacturing the sensing apparatus 10 can further include a step of forming a contact window (not shown) in the gate insulation layer GI in the peripheral area of the substrate 100, so as to form a connection line configured to be connected to external circuits in subsequent manufacturing steps. Here, the external circuits are, for example, driver chips or a flexible printed circuit (FPC). In particular, the contact window can be formed by performing a third PEP.

Figure 2C:
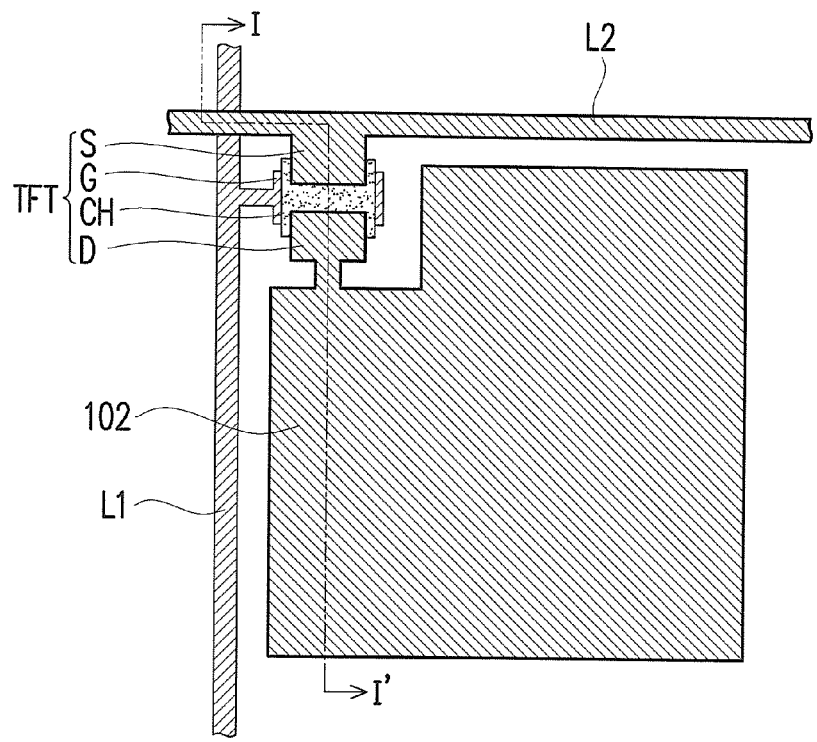

With reference to FIG. 2C and FIG. 3C, a source S, a drain D, a second signal line L2, and a first electrode layer 102 are formed on the substrate 100. Here, the source S and the second signal line L2 are electrically connected, the drain D and the first electrode layer 102 are electrically connected, and the source S and the drain D are located at two sides of the channel layer CH.

In particular, the source S, the drain D, the second signal line L2, and the first electrode layer 102 can be formed by performing a fourth PEP. In consideration of conductivity, the source S, the drain D, the second signal line L2, and the first electrode layer 102 are often made of metal materials. However, the invention is not limited thereto; according to other embodiments of the invention, the source S, the drain D, the second signal line L2, and the first electrode layer 102 may be made of conductive materials other than metal materials, such as alloy, metal oxide, metal nitride, metal oxynitride, or a stacked layer of metal and other conductive materials. In the present embodiment, the source S, the drain D, the second signal line L2, and the first electrode layer 102 belong to the same film layer. That is, the source S, the drain D, the second signal line L2, and the first electrode layer 102 are constituted by the same metal layer.

Besides, the first signal line L1 and the second signal line L2 are intersected. Namely, an extension direction of the first signal line L1 is not parallel to an extension direction of the second signal line L2. In FIG. 2C, the extension direction of the first signal line L1 is substantially perpendicular to the extension direction of the second signal line L2, for instance.

According to the present embodiment, after the source S and the drain D are formed, the active device TFT is initially manufactured, and the active device TFT includes the gate G, the gate insulation layer GI, the channel layer CH, the source S, and the drain D. Since the channel layer CH is made of an amorphous silicon semiconductor material, the active device TFT is an amorphous silicon TFT.

Figure 2D:
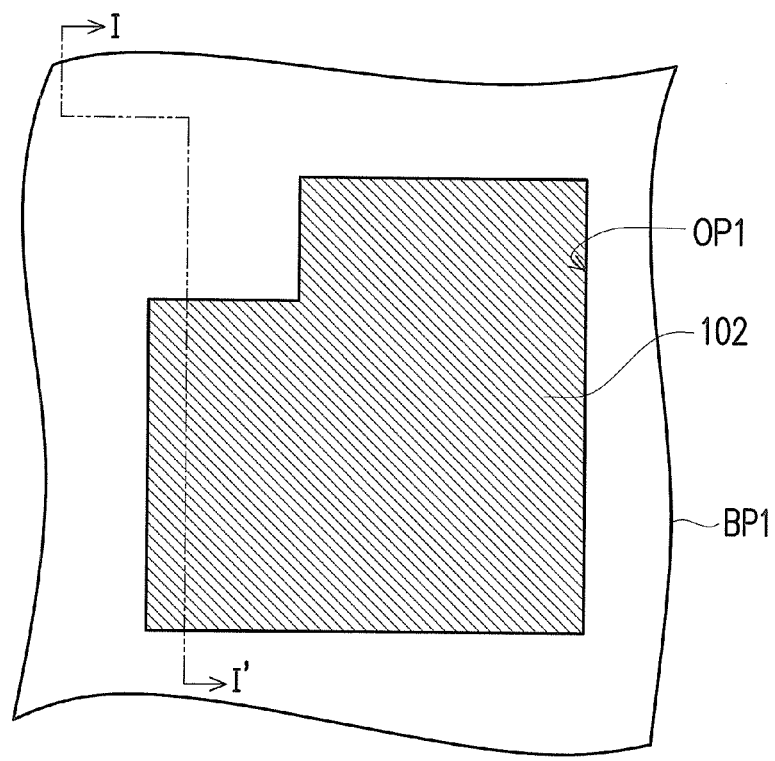

With reference to FIG. 2D and FIG. 3D, a first protection layer 100 is formed on the substrate 100 to cover the active device TFT and the first electrode layer 102. Here, the first protection layer BP1 has a first opening OP1 exposing a portion of the first electrode layer 102. In particular, the first protection layer BP1 can be formed by performing a fifth PEP. The first protection layer BP1 is made of inorganic materials, such as SiOx, SiNx, silicon oxynitride, etc.

Figure 2E:
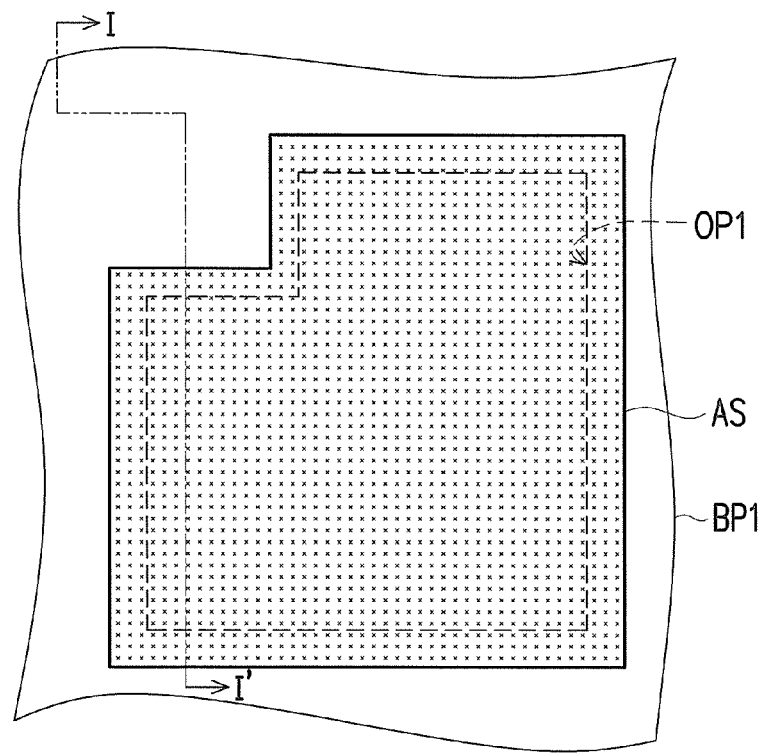
Figure 3E:
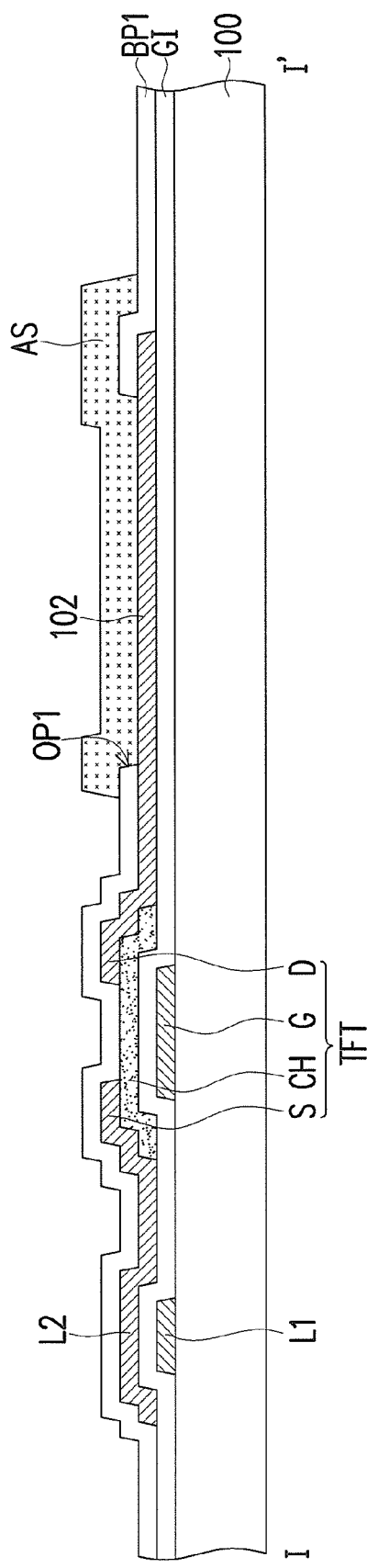

With reference to FIG. 2E and FIG. 3E, an amorphous silicon layer AS is formed on the first protection layer BP1, and the amorphous silicon layer AS fills into the first opening OP1 so as to be in contact with the first electrode layer 102. In particular, the amorphous silicon layer AS can be formed by performing a sixth PEP. A thickness of the amorphous silicon layer AS is within a range from 500 angstroms (Å) to 15000 Å, preferably from 2000 Å to 10000 Å.

Figure 2F:
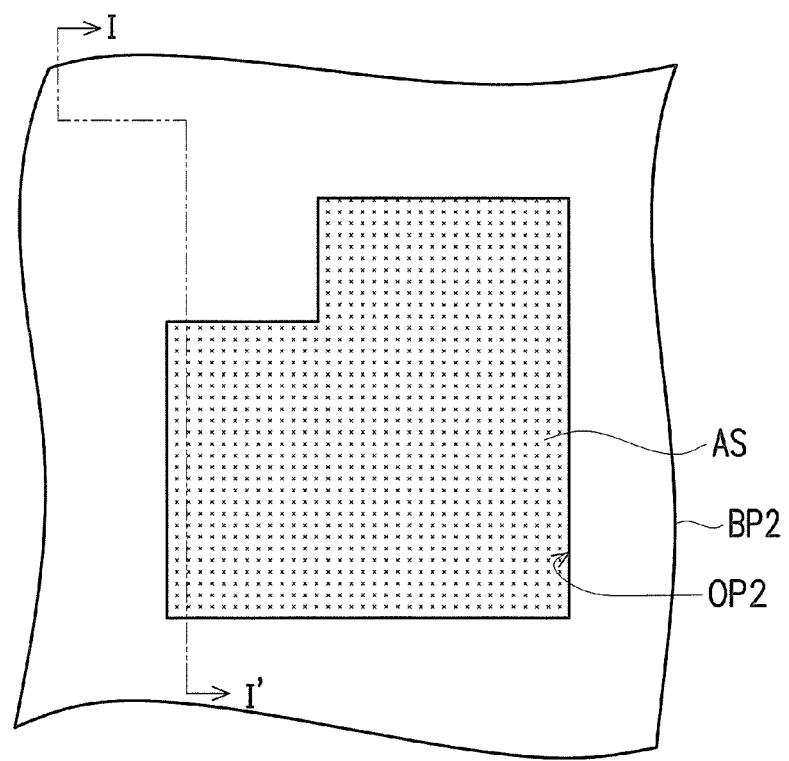
Figure 3F:
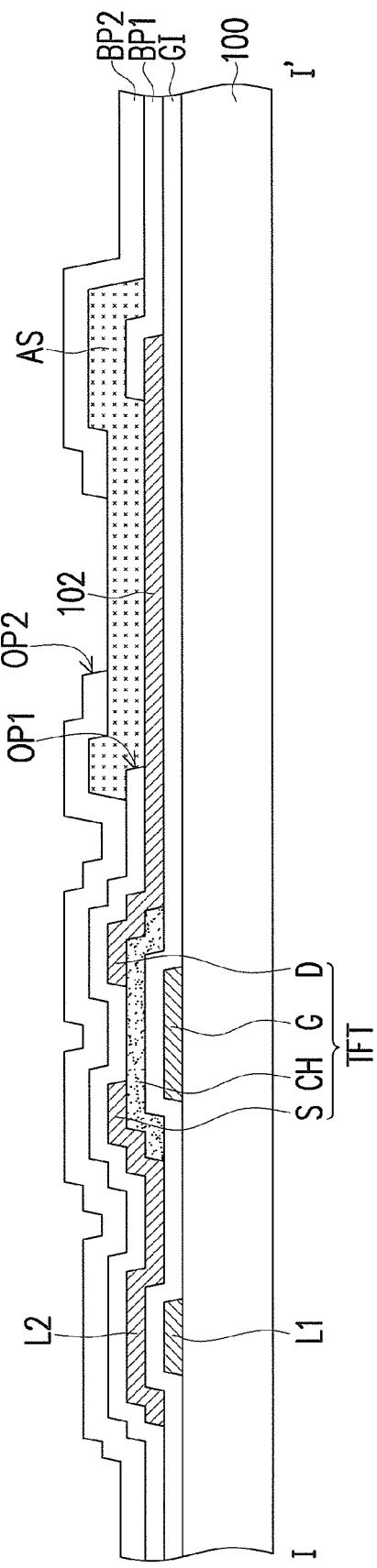

With reference to FIG. 2F and FIG. 3F, a second protection layer BP2 is formed on the substrate 100 to cover the first protection layer BP1 and the amorphous silicon layer AS. Here, the second protection layer BP2 has a second opening OP2, and the second opening OP2 corresponds to the first opening OP1 of the first protection layer BP1 and exposes the amorphous silicon layer AS. In particular, the second protection layer BP2 can be formed by performing a seventh PEP. The second protection layer BP2 is made of inorganic materials, such as SiOx, SiNx, silicon oxynitride, etc. A thickness of the second protection layer BP2 is within a range from 500 angstroms Å to 15000 Å, preferably from 2000 Å to 10000 Å. Specifically, the thickness of the amorphous silicon layer AS can be reduced to the range from 500 angstroms Å to 15000 Å, and therefore the thickness of the second protection layer BP2 configured to protect the amorphous silicon layer AS can be reduced as well, so as to reduce the time spent on the deposition process and the costs of the deposition process.

Figure 2G:
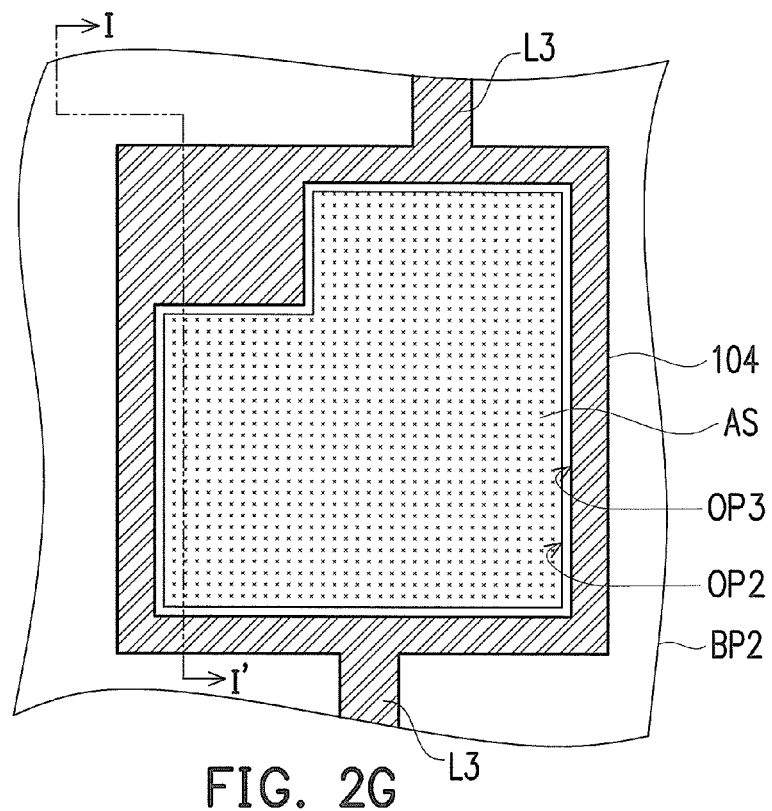
Figure 3G:
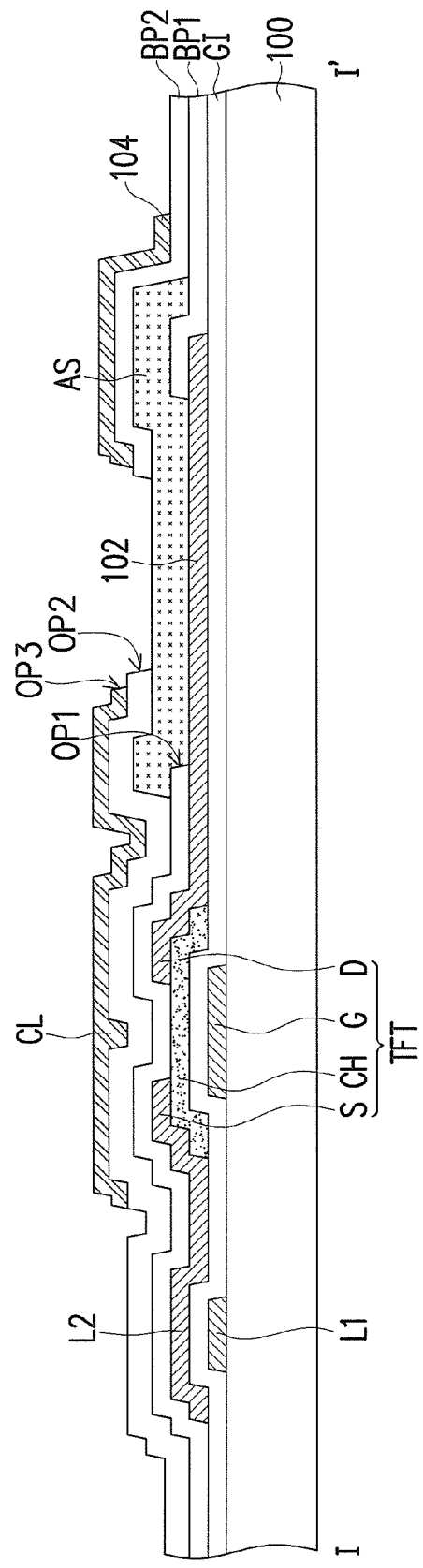

With reference to FIG. 2G and FIG. 3G, a second electrode layer 104 and a third signal line L3 are formed on the second protection layer BP2. Here, the second electrode layer 104 has an opening OP3, and the opening OP3 corresponds to the second opening OP2 of the second protection layer BP2 and exposes a portion of the amorphous silicon layer AS. Besides, in the present embodiment, a cover layer CL is further located on the second protection layer BP2. Here, the cover layer CL is located above the active device TFT and covers the channel layer CH of the active device TFT. The cover layer CL and the second electrode layer 104 are connected, i.e., the cover layer CL and the second electrode layer 104 are electrically connected. The channel layer CH of the active device TFT is made of amorphous silicon that is a semiconductor material capable of performing light-electricity conversion; therefore, if the channel layer CH is not covered by the cover layer CL, optical carriers are likely to be generated in the channel layer CH irradiated by light. The optical carriers may turn on the channel layer CH, such that the active device TFT cannot be switched off and can no longer serve as a switch device. Besides, the third signal line L3 and the second electrode layer 104 are conductive patterns connected together. Therefore, the third signal line L3 and the second electrode layer 104 are electrically connected to each other.

In particular, the second electrode layer 104, the cover layer CL, and the third signal line L3 can be formed by performing an eighth PEP. The second electrode layer 104, the cover layer CL, and the third signal line L3 may have a single-layered structure or a multi-layered stacked structure. If the second electrode layer 104, the cover layer CL, and the third signal line L3 have the single-layered structure, the second electrode layer 104, the cover layer CL, and the third signal line L3 are made of copper, nickel, iron, gold, copper-nickel alloy, or gold-nickel alloy; if the second electrode layer 104, the cover layer CL, and the third signal line L3 have the stacked structure, the second electrode layer 104, the cover layer CL, and the third signal line L3 are made of nickel/gold dual-layered metal layer, titanium/gold dual-layered metal layer, titanium/aluminum/titanium triple-layered metal layer, or molybdenum/aluminum/molybdenum triple-layered metal layer.

In the present embodiment, the second protection layer BP2 is formed by performing the seventh PEP, and the second electrode layer 104, the cover layer CL, and the third signal line L3 are formed by performing the eighth PEP. That is, the second protection layer BP2 and the second electrode layer 104, the cover layer CL and the third signal line L3 are formed by performing different PEPs; however, the invention is not limited thereto. According to another embodiment, the second protection layer BP2, the second electrode layer 104, the cover layer CL, and the third signal line L3 can be formed by performing the same PEP.

Figure 2H:
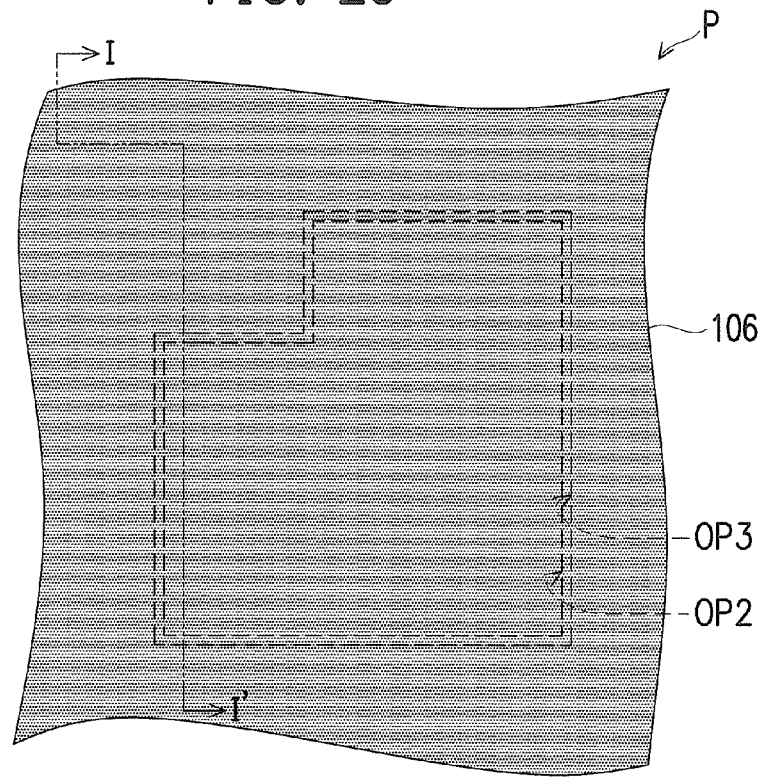
Figure 3H:
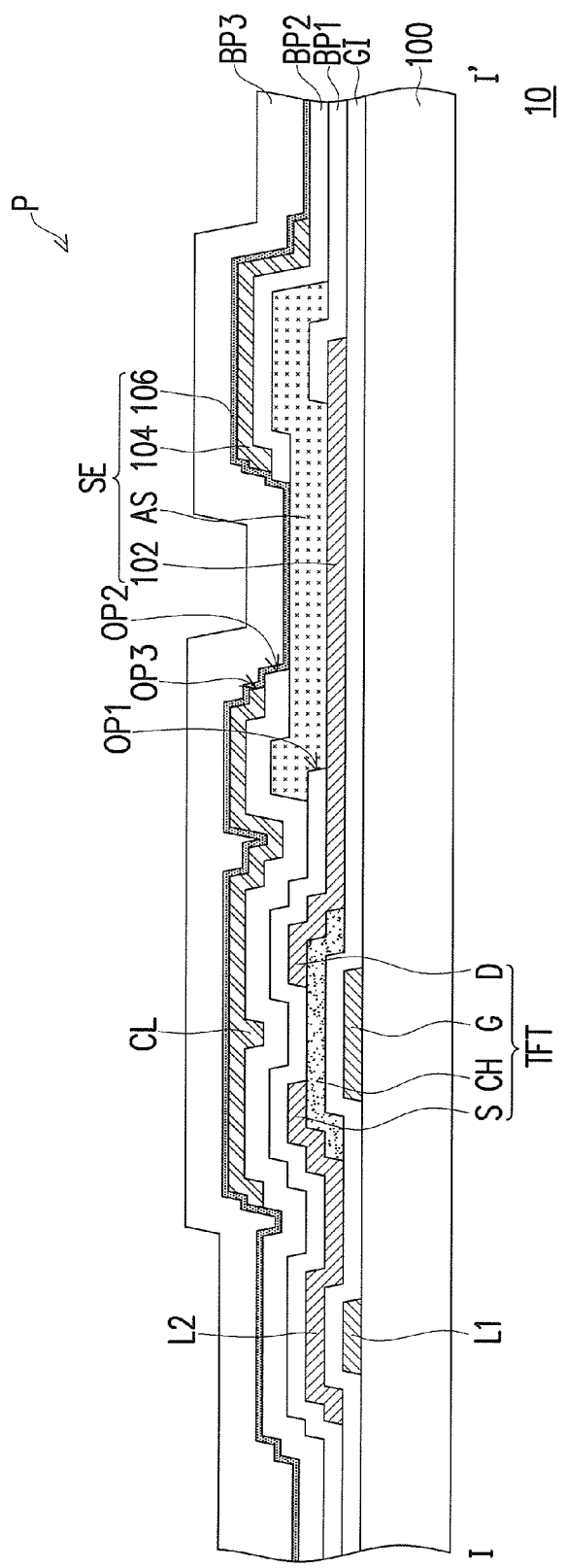

With reference to FIG. 2H and FIG. 3H, a graphene layer 106 is formed on the second electrode layer 104, the cover layer CL, and the third signal line L3. Here, the graphene layer 106 completely covers the second electrode layer 104, the cover layer CL, the third signal layer L3, and the amorphous silicon layer AS, and the graphene layer 106 is in contact with the amorphous silicon layer AS. In general, the graphene layer is a thin layer constituted by $sp^2$-hybridized carbon atoms arranged in hexagonal honeycomb crystal lattice. That is, one layer of graphene is a two-dimensional material with the thickness of one carbon atom. In the present embodiment, the number of layers of the graphene layer 106 is within a range from one to five.

Besides, the graphene layer 106 may be a p-type graphene layer doped with group III compounds or an undoped graphene layer. Here, the graphene layer 106 can be formed by CVD or plasma enhanced chemical vapor deposition (PECVD). Specifically, the graphene layer 106 is formed by introducing hydrogen, argon, and reaction gas containing carbon atoms (e.g., methane or acetylene) into the CVD system chamber or PECVD system chamber to deposit the undoped graphene layer; alternatively, adding reaction gas containing the group III compounds (e.g., $B_2H_6$ or $B(CH_3)_3$) to the above reaction gas containing carbon atoms to deposit the p-type graphene layer. Here, the CVD temperature ranges from about 200° C. to about 400° C.

According to the present embodiment, after the graphene layer 106 is formed, the sensing device SE is initially manufactured, and the sensing device SE includes the first electrode layer 102, the amorphous silicon layer AS, the second electrode layer 104, and the graphene layer 106. The electrical property of the amorphous silicon layer AS is similar to those of the slightly doped n-type semiconductor material; hence, when the graphene layer 106 is the p-type graphene layer which belongs to the p-type semiconductor material, the junction of the amorphous silicon layer AS and the graphene layer 106 is a PN junction, and the sensing device SE is a photosensitive PN diode sensing device. In particular, the I-V curve of the sensing device SE shows that the dark leakage current in a reverse bias zone is rather insignificant, and the illuminating current is proportional to the amount of the illuminating photons; therefore, the sensing device SE can serve as a photosensitive device for sensing light. Besides, when the graphene layer 106 is the undoped graphene layer, which is a zero band gap material and behaves like a metal, the contact surface of the amorphous silicon layer AS and the graphene layer 106 is a schottky junction, and the sensing device SE is a schottky diode sensing device capable of sensing light and may also serve as the photosensitive device for sensing light. Although the electrical property of the amorphous silicon layer AS is similar to those of the slightly doped n-type semiconductor material, the amorphous silicon layer AS may be doped with group V compounds based on actual requirements, so as to form the n-type amorphous silicon layer having the property similar to those of the n-type semiconductor material.

From another perspective, the sensing device SE in the sensing apparatus 10 is a schottky diode sensing device or a PN diode sensing device constituted by the amorphous silicon layer AS and the graphene layer 106 that may be the p-type graphene layer or the undoped graphene layer, and the schottky diode sensing device or the PN diode sensing device described herein replaces the PIN diode or the schottky diode applied in the conventional sensing apparatus. As described above, the thickness of the amorphous silicon layer AS is within a range from 500 Å to 15000 Å, and the number of layers of the graphene layer 106 is within a range from one to five; therefore, compared to the conventional sensing apparatus, the sensing apparatus 10 is characterized by the sensing device SE with the reduced thickness and the favorable incident photon-to-electron conversion efficiency (IPCE).

Besides, in the present embodiment, the cover layer CL that covers the channel layer CH is formed together with the second electrode layer 104 and the third signal line L3. That is, in the present embodiment, no additional PEP is required for forming the cover layer CL; instead, in one PEP, the second electrode layer 104, the cover layer CL, and the third signal line L3 can be simultaneously formed.

With reference to FIG. 2H and FIG. 3H, after the graphene layer 106 is formed, the third protection layer BP3 can be further formed on the substrate 100. The third protection layer BP3 covers the active device TFT and the sensing device SE for protecting the active device TFT and the sensing device SE from being affected by external moisture, heat, and noise and from being damaged by external forces. In general, the third protection layer BP3 can be comprehensively deposited onto the substrate 100 through PVD or CVD. For instance, the third protection layer BP3 is made of inorganic materials, such as SiOx, SiNx, silicon oxynitride, etc. For illustrative purposes, the third protection layer BP is not depicted in FIG. 2H.

According to the method of manufacturing the sensing apparatus 10, after the third protection layer BP3 is comprehensively deposited onto the substrate 100, a contact window (not shown) can be further formed in the third protection layer BP3 in the peripheral area, and the contact window may serve to connect the first, second, and third signal lines L1, L2, and L3 to external circuits (e.g., driver chips or FPC). In particular, the contact window can be formed by performing a ninth PEP.

After all of the steps shown in FIG. 2A to FIG. 2H and FIG. 3A to FIG. 3H are performed, the sensing apparatus 10 provided in an embodiment of the invention is completely formed. Particularly, in the previous embodiment, the sensing apparatus 10 may be formed by performing nine PEPs. That is, the sensing apparatus 10 described herein may be manufactured by performing the reduced numbers of PEPs, such that the complexity of the overall manufacturing process and the manufacturing costs can be both reduced.

The structure of the sensing apparatus 10 is explained hereinafter according to an embodiment of the invention with reference to FIG. 1, FIG. 2H, and FIG. 3H.

With reference to FIG. 1, FIG. 2H, and FIG. 3H, the sensing apparatus 10 includes a plurality of sensing pixels P arranged in an array, and each of the sensing pixels P includes a first signal line L1, a second signal line L2, a third signal line L3, an active device TFT, and a sensing device SE. The active device TFT includes a gate G, a gate insulation layer GI, a channel layer CH, a source S, and a drain D. The sensing device SE is electrically connected to the active device TFT. Here, the sensing device SE includes a first electrode layer 102, an amorphous silicon layer AS, a second electrode layer 104, and a graphene layer 106. The amorphous silicon layer AS is located on the first electrode layer 102. The second electrode layer 104 is located on the amorphous silicon layer AS. The graphene layer 106 covers the second electrode layer 104 and is in contact with the amorphous silicon layer AS. Besides, the sensing apparatus 10 may further include a cover layer CL, a first protection layer BP1, a second protection layer BP2, and a third protection layer BP3. The material, the effects, and the manufacturing method of each component of the sensing apparatus 10 are described in details in the above embodiments, and hence no further description is provided hereinafter.

To be specific, the first electrode layer 102 and the drain D in the sensing apparatus 10 are conductive patterns connected together, and thereby the sensing device SE is electrically connected to the active device TFT. Besides, in the sensing apparatus 10, the gate G and the first signal line L1 are conductive patterns connected together, and the source S and the second signal line L2 are conductive patterns connected together; thereby, the first signal line L1 and the second signal line L2 can transmit signals generated by the active device TFT; in addition, the second electrode layer 104 and the third signal line L3 are conductive patterns connected together, such that a common voltage can be supplied to the sensing pixels P through the third signal line L3.

As described above, given that the thickness of the amorphous silicon layer AS is within a range from 500 Å to 15000 Å, and that the number of layers of the graphene layer 106 is within a range from one to five, the sensing device SE is able to achieve favorable IPCE; therefore, compared to the conventional sensing apparatus, the sensing apparatus 10 can have the reduced thickness.

In the present embodiment, the active device TFT is an amorphous silicon TFT, and the sensing device SE includes the PN diode constituted by the amorphous silicon layer AS and the graphene layer 106 which belongs to the p-type semiconductor or the schottky diode constituted by the amorphous silicon layer AS and the graphene layer 106 which is undoped, such that the sensing apparatus 10 can be suitable for the large area production, and the applicability and the commercial value of the sensing apparatus 10 can be further enhanced. For instance, the sensing apparatus 10 can be applied to large-size photosensitive apparatuses, such as 14"×17" or 17"×17" medical digital X-ray radiation detector or X-ray detector employed by custom officials for examining passenger's baggage.

Figure 4:
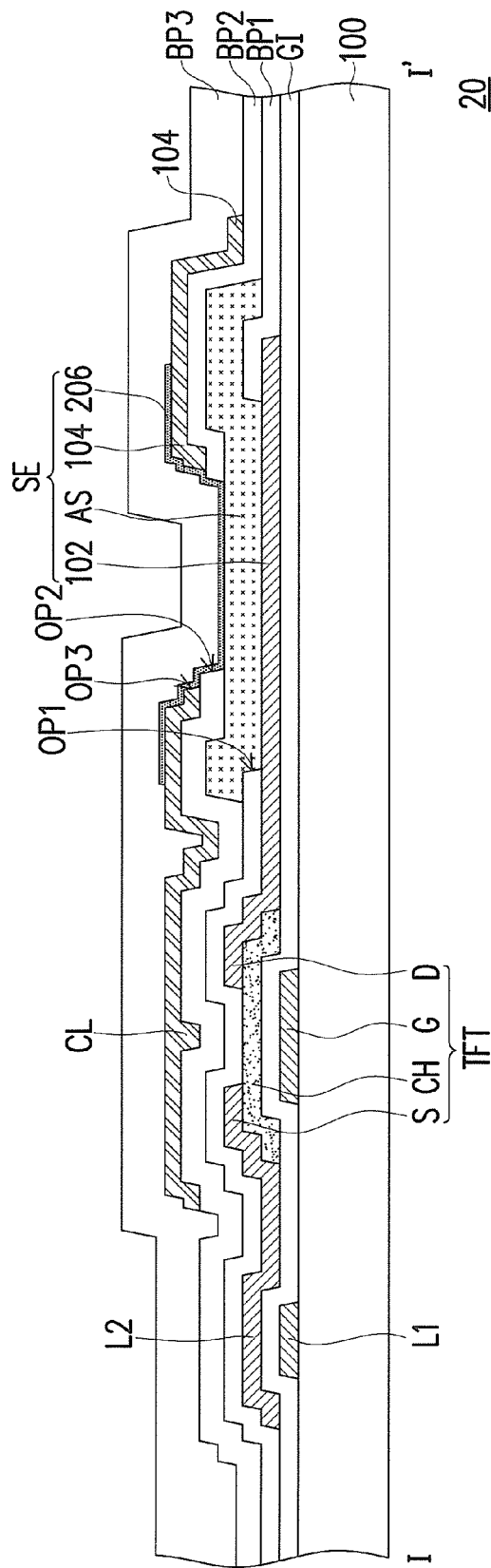
FIG. 4 is a schematic cross-sectional view illustrating a sensing apparatus according to another embodiment of the invention.

FIG. 4 is a schematic cross-sectional view illustrating a sensing apparatus according to another embodiment of the invention. With reference to FIG. 3H and FIG. 4, the sensing apparatus 20 provided in the embodiment depicted in FIG. 4 is similar to the sensing apparatus 10 provided in the embodiment depicted in FIG. 3H; therefore, the identical or similar devices depicted in FIG. 3H and FIG. 4 are represented by the identical or similar reference numbers and will not be further explained. The difference between the sensing apparatus 20 depicted in FIG. 4 and the sensing apparatus 10 illustrated in FIG. 3H lies in that the graphene layer 206 depicted in FIG. 4 partially covers the second electrode layer 104 and extends into the opening OP2 from an edge of the opening OP2, and the graphene layer 206 covers the amorphous silicon layer AS exposed by the opening OP2. By contrast, the graphene layer 106 depicted in FIG. 3H completely covers the second electrode layer 104. That is, the graphene layer 206 described herein is a patterned film layer and is formed through patterning process or selective area growth.

Figure 5A:
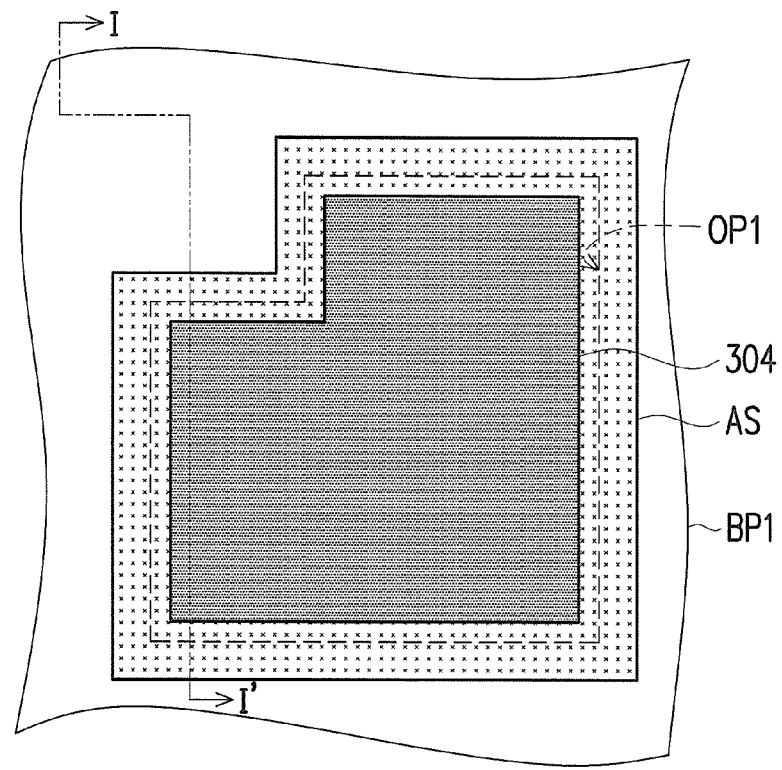
FIG. 5A and FIG. 5B are top views illustrating a method of manufacturing a sensing apparatus according to another embodiment of the invention.
Figure 5B:
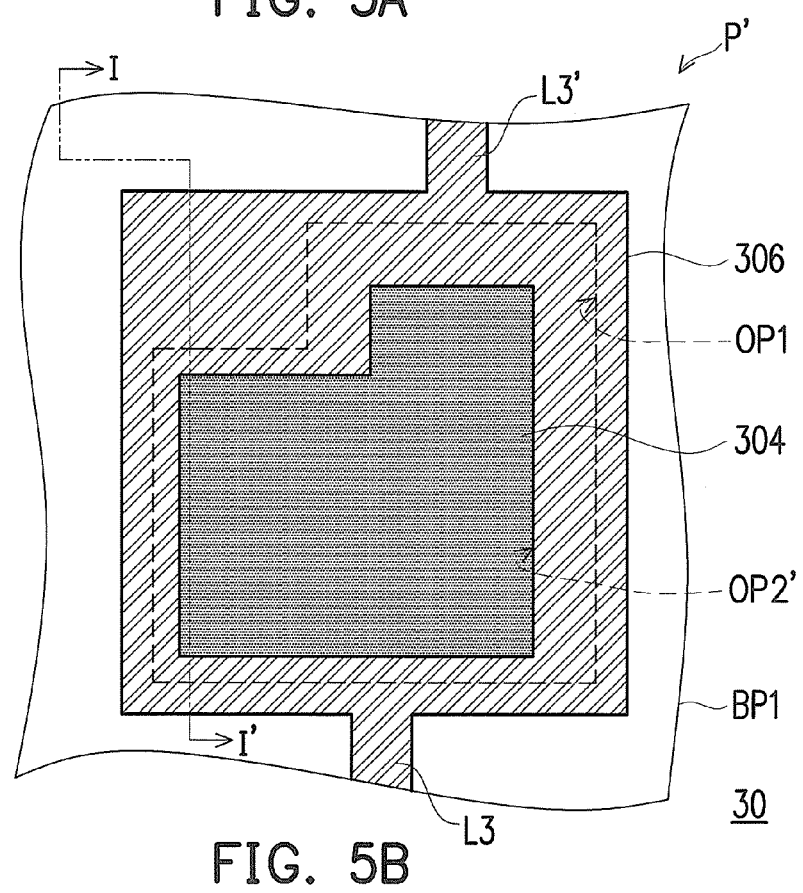
Figure 6A:
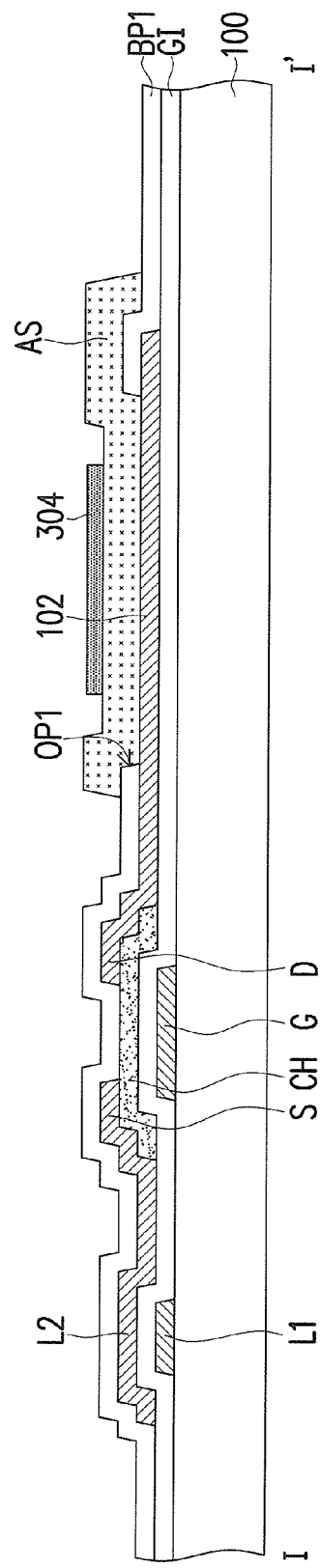
FIG. 6A and FIG. 6B are cross-sectional views illustrating a method of manufacturing a sensing apparatus according to another embodiment of the invention.
Figure 6B:
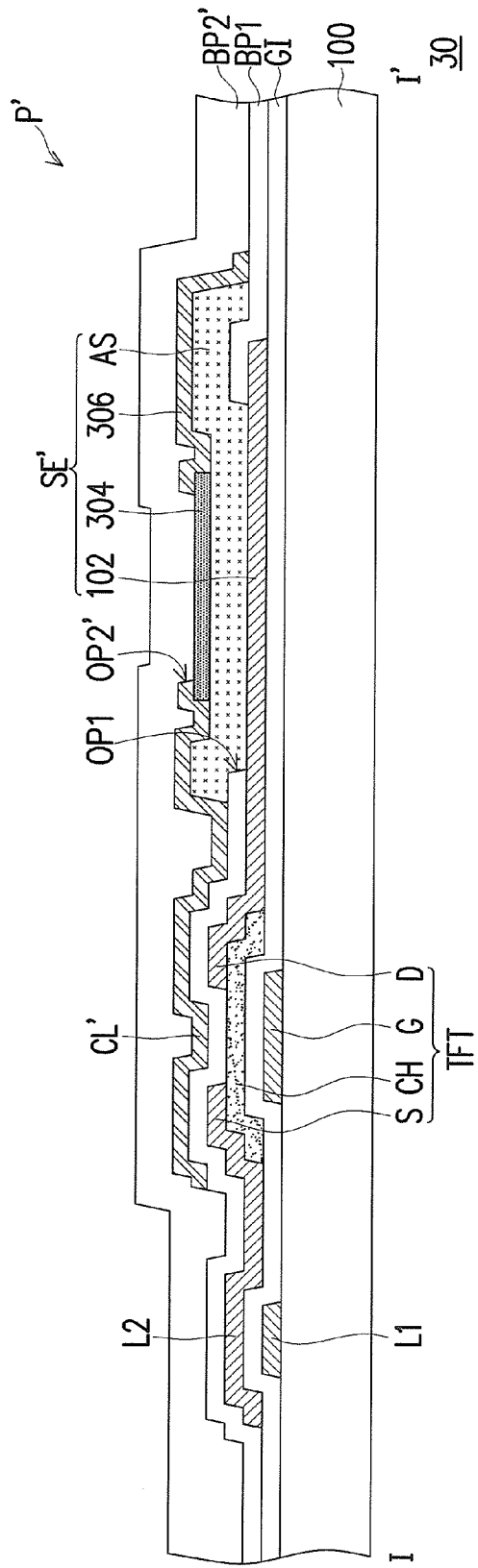

FIG. 5A and FIG. 5B are top views illustrating a method of manufacturing a sensing apparatus according to another embodiment of the invention. FIG. 6A and FIG. 6B are cross-sectional views illustrating a method of manufacturing a sensing apparatus according to another embodiment of the invention. The cross-sectional location shown in FIG. 6A and FIG. 6B corresponds to the location of the sectional line I-I' depicted in FIG. 5A and FIG. 5B, and the steps shown in FIG. 2E and FIG. 3E are followed by the steps shown in FIG. 5A and FIG. 6A. By performing all of the steps depicted in FIG. 5A and FIG. 5B as well as FIG. 6A and FIG. 6B, the sensing apparatus 30 described in another embodiment of the invention can be completely formed, and the schematic top view of the sensing apparatus 30 is shown in FIG. 1. Detailed steps of manufacturing the sensing apparatus 30 are described below.

With reference to FIG. 5A and FIG. 6A, a graphene layer 304 is formed on the amorphous silicon layer AS, and the graphene layer 304 partially covers the amorphous silicon layer AS. Namely, in a vertical projection direction, the area occupied by the graphene layer 304 is smaller than the area occupied by the amorphous silicon layer AS. In general, the graphene layer is a thin layer constituted by $sp^2$-hybridized carbon atoms arranged in hexagonal honeycomb crystal lattice. That is, one layer of graphene is a two-dimensional material with the thickness of one carbon atom. In the present embodiment, the number of layers of the graphene layer 304 is within a range from one to five.

Besides, the graphene layer 304 may be a p-type graphene layer doped with group III compounds or an undoped graphene layer. The graphene layer 304 may be formed by transfer-printing. Particularly, in the method of forming the graphene layer 304, a stamp made of polymer materials may be applied, a pre-grown p-type graphene layer or an undoped graphene layer is then absorbed onto the stamp through micro-imprinting, and the absorbed graphene layer is then transfer-printed onto the amorphous silicon layer AS.

With reference to FIG. 5B and FIG. 6B, a second electrode layer 306 and a third signal line L3' are formed on the first protection layer BP1. The second electrode layer 306 partially covers the graphene layer 304 and has the second opening OP2'; here, the second opening OP2' corresponds to the first opening OP1 of the first protection layer BP1 and exposes a portion of the graphene layer 304. In particular, the second electrode layer 306 covers the side of the graphene layer 304, surrounds the graphene layer 304, and covers a portion of an upper surface of the graphene layer 304. Besides, in the present embodiment, a cover layer CL' is further located on the first protection layer BP1. Here, the cover layer CL' is located above the active device TFT and covers the channel layer CH of the active device TFT. The cover layer CL' and the second electrode layer 104 are connected, i.e., the cover layer CL' and the second electrode layer 104 are electrically connected. The channel layer CH of the active device TFT is made of amorphous silicon that is a semiconductor material capable of performing light-electricity conversion; therefore, if the channel layer CH is not covered by the cover layer CL', optical carriers are likely to be generated in the channel layer CH irradiated by light. The optical carriers may turn on the channel layer CH, such that the active device TFT cannot be switched off and can no longer serve as a switch device. Besides, the third signal line L3' and the second electrode layer 306 described in the present embodiment are conductive patterns connected together. Therefore, the third signal line L3' and the second electrode layer 306 are electrically connected to each other.

The second electrode layer 306, the cover layer CL', and the third signal line L3' may have a single-layered structure or a multi-layered stacked structure. If the second electrode layer 306, the cover layer CL', and the third signal line L3' have the single-layered structure, the second electrode layer 306, the cover layer CL', and the third signal line L3' are made of copper, nickel, iron, gold, copper-nickel alloy, or gold-nickel alloy; if the second electrode layer 306, the cover layer CL', and the third signal line L3' have the stacked structure, the second electrode layer 306, the cover layer CL', and the third signal line L3' are made of nickel/gold dual-layered metal layer, titanium/gold dual-layered metal layer, titanium/aluminum/titanium triple-layered metal layer, or molybdenum/aluminum/molybdenum triple-layered metal layer.

According to the present embodiment, after the second electrode layer 306 is formed, the sensing device SE' is initially manufactured, and the sensing device SE' includes the first electrode layer 102, the amorphous silicon layer AS, the second electrode layer 306, and the graphene layer 304. The electrical property of the amorphous silicon layer AS is similar to those of the slightly doped n-type semiconductor material; hence, when the graphene layer 304 is the p-type graphene layer which belongs to the p-type semiconductor material, the junction of the amorphous silicon layer AS and the graphene layer 304 is a PN junction, and the sensing device SE' is a photosensitive PN diode sensing device. In particular, the I-V curve of the sensing device SE' shows that the dark leakage current in a reverse voltage zone is rather insignificant, and the illuminating current is proportional to the amount of the illuminating photons; therefore, the sensing device SE' can serve as a photosensitive device for sensing light. Besides, when the graphene layer 304 is the undoped graphene layer, the property of the graphene layer 304 is similar to those of a metal layer in a zero energy state. At this time, the contact surface of the amorphous silicon layer AS and the graphene layer 304 is a schottky junction, and the sensing device SE' is a schottky diode sensing device capable of sensing light and may also serve as the photosensitive device for sensing light. Although the electrical property of the amorphous silicon layer AS is similar to those of the slightly doped n-type semiconductor material, the amorphous silicon layer AS may be doped with group V compounds based on actual requirements, so as to form the n-type amorphous silicon layer having the property similar to those of the n-type semiconductor metal material.

In the present embodiment, the active device TFT is an amorphous silicon TFT, and the sensing device SE' includes the PN diode constituted by the amorphous silicon layer AS and the graphene layer 304 which belongs to the p-type semiconductor or the schottky diode constituted by the amorphous silicon layer AS and the graphene layer 304 which is undoped, such that the sensing apparatus 30 can be suitable for the large area production, and the applicability and the commercial value of the sensing apparatus 30 can be further enhanced. For instance, the sensing apparatus 30 can be applied to large-size photosensitive apparatuses, such as 14"× 17" or 17"×17" medical digital X-ray radiation machine or X-ray machine employed by custom officials for examining passenger's baggage.

As described above, given that the thickness of the amorphous silicon layer AS is within a range from 500 Å to 15000 Å, and that the number of layers of the graphene layer 304 is within a range from one to five, the sensing device SE' is able to achieve favorable IPCE; therefore, compared to the conventional sensing apparatus, the sensing apparatus 30 can have the reduced thickness.

Besides, in the present embodiment, the cover layer CL' that covers the channel layer CH is formed together with the second electrode layer 306 and the third signal line L3'. That is, in the present embodiment, no additional PEP is required for forming the cover layer CL; instead, in one PEP, the second electrode layer 306, the cover layer CL', and the third signal line L3' can be simultaneously formed.

In the sensing apparatus 30, the second electrode layer 306, the cover layer CL', and the third signal line L3' are conductive patterns connected together, such that a common voltage can be supplied to the sensing pixels P' through the third signal line L3'.

With reference to FIG. 5B and FIG. 6B, after the second electrode layer 306, the cover layer CL', and the third signal line L3' are formed, a second protection layer BP2' can be further formed on the substrate 100. The second protection layer BP2' covers the active device TFT and the sensing device SE' for protecting the active device TFT and the sensing device SE' from being affected by external moisture, heat, and noise and from being damaged by external forces. In general, the second protection layer BP2' can be comprehensively deposited onto the substrate 100 through PVD or CVD. For instance, the second protection layer BP2' is made of inorganic materials, such as SiOx, SiNx, silicon oxynitride, etc. For illustrative purposes, the second protection layer BP2' is not depicted in FIG. 5B.

According to the method of manufacturing the sensing apparatus 30, after the second protection layer BP2' is comprehensively deposited onto the substrate 100, a contact window (not shown) can be further formed in the second protection layer BP2' in the peripheral area, and the contact window may serve to connect the first, second, and third signal lines L1, L2, and L3' to external circuits (e.g., driver chips or FPC).

Figure 7:
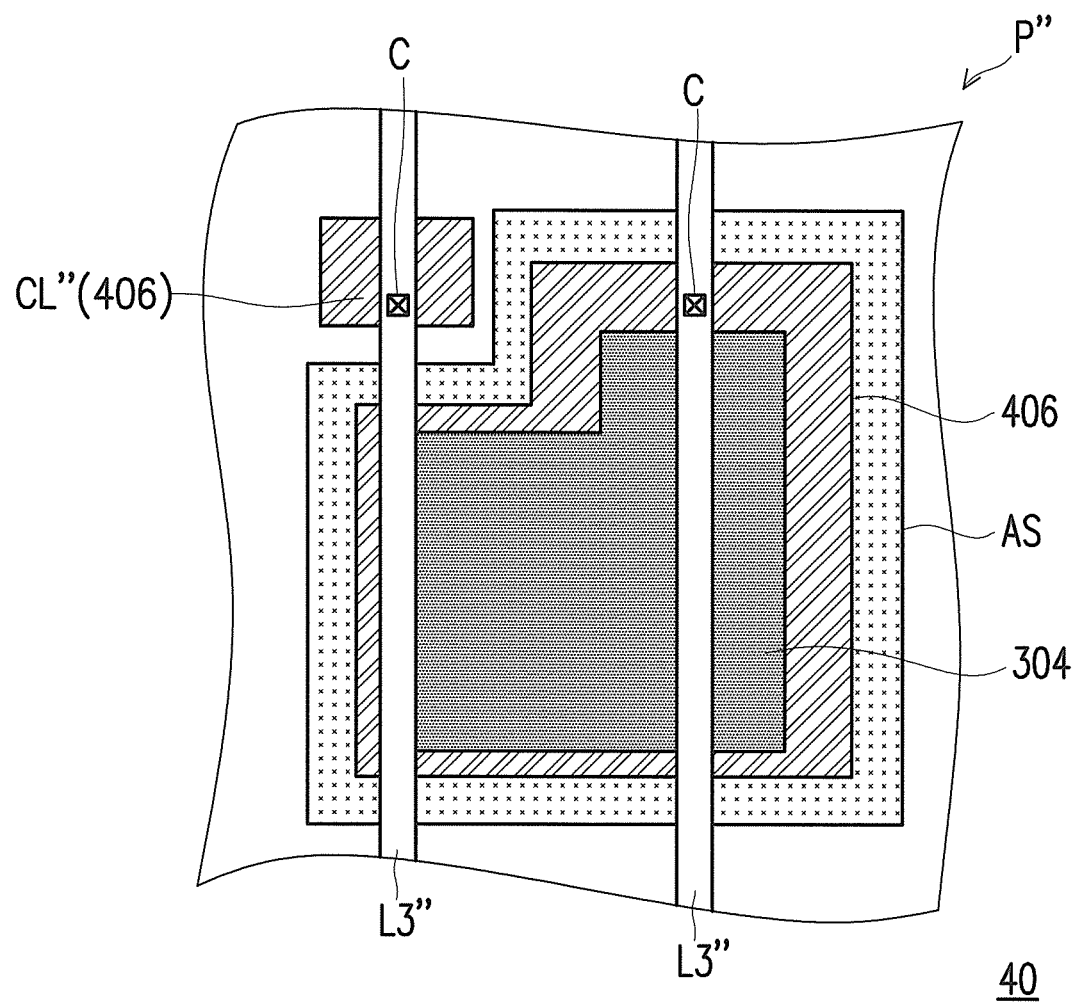
FIG. 7 is a schematic top view illustrating a sensing apparatus according to another embodiment of the invention.

FIG. 7 is a schematic top view illustrating a sensing apparatus according to another embodiment of the invention. The sensing apparatus 40 provided in the embodiment depicted in FIG. 7 is similar to the sensing apparatus 30 provided in the embodiment depicted in FIG. 5B; therefore, the identical or similar devices depicted in FIG. 5B and FIG. 7 are represented by the identical or similar reference numbers and will not be further explained.

Specifically, the difference between the sensing apparatus 40 depicted in FIG. 7 and the sensing apparatus 30 illustrated in FIG. 5B lies in that the cover layer CL" shown in FIG. 7 is not connected to the second electrode layer 406. That is, in the embodiment shown in FIG. 7, the cover layer CL" and the second electrode layer 406 are separate conductive patterns, while the cover layer CL' and the second electrode layer 306 shown in FIG. 5B are continuous conductive patterns. Besides, as shown in FIG. 7, the third signal line L3" is electrically connected to the second electrode layer 406 through a contact window C. The third signal line L3" and the second electrode layer 406 belong to different film layers, and the second protection layer (not shown) having the contact window C is located between the second electrode layer 406 and the third signal line L3". By contrast, as shown in FIG. 5B, the second electrode layer 306, the third signal line L3' and the cover layer CL' belong to the same film layer and are conductive patterns connected together. In another aspect, according to the embodiment depicted in FIG. 7, the second electrode layer 406 and the third signal line L3" in the sensing apparatus 40 are connected through the contact window C, such that a common voltage can be supplied to the sensing pixels P″ through the third signal line L3″; by contrast, according to the embodiment depicted in FIG. 5B, the second electrode layer 306 and the third signal line L3' in the sensing apparatus 30 are conductive patterns connected together, such that a common voltage can be supplied to the sensing pixels P' through the third signal line L3'.

To sum up, in the sensing apparatus described herein, each sensing pixel includes the first signal line, the second signal line, the third signal line, the active device, and the sensing device that includes a schottky diode or a PN diode constituted by the amorphous silicon layer and the graphene layer. Thereby, the sensing apparatus characterized by favorable IPCE can have the reduced thickness, and the sensing apparatus can be suitable for the large area production. Moreover, because in one single PEP, the second electrode layer and the cover layer can be simultaneously formed, and because the graphene can be formed by CVD or transfer printing, the sensing apparatus described herein can be manufactured by performing less numbers of PEPs, thus lowering the complexity of the manufacturing process and reducing the manufacturing time.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A sensing apparatus comprising a plurality of sensing pixels arranged in an array, each of the sensing pixels comprising:
   an active device; and
   a sensing device electrically connected to the active device, wherein the sensing device comprising:
   a first electrode layer;
   an amorphous silicon layer located on the first electrode layer;
   a second electrode layer located on the amorphous silicon layer, wherein the second electrode layer has an opening; and
   a graphene layer in contact with the second electrode layer and the amorphous silicon layer.

2. The sensing apparatus as recited in claim 1, wherein the opening exposes the amorphous silicon layer, and the graphene layer completely covers the second electrode layer and the amorphous silicon layer.

3. The sensing apparatus as recited in claim 1, wherein the graphene layer partially covers the second electrode layer and extends into the opening from an edge of the opening, and the graphene layer covers the amorphous silicon layer exposed by the opening.

4. The sensing apparatus as recited in claim 1, wherein the graphene layer is located between the amorphous silicon layer and the second electrode layer, the graphene layer partially covers the amorphous silicon layer, and the second electrode layer partially covers the graphene layer, such that the opening exposes the graphene layer.

5. The sensing apparatus as recited in claim 1, further comprising a cover layer located above the active device.

6. The sensing apparatus as recited in claim 5, wherein the cover layer and the second electrode layer are electrically connected to each other.

7. The sensing apparatus as recited in claim 1, wherein a material of the second electrode layer comprises copper, nickel, iron, gold, nickel/gold dual-layered metal layer, titanium/gold dual-layered metal layer, copper-nickel alloy, gold-nickel alloy, titanium/aluminum/titanium triple-layered metal layer, or molybdenum/aluminum/molybdenum triple-layered metal layer.

8. The sensing apparatus as recited in claim 1, wherein a thickness of the amorphous silicon layer is within a range from 500 angstroms to 15000 angstroms, and a number of layers of the graphene layer is within a range from one to five.

9. The sensing apparatus as recited in claim 1, wherein the graphene layer is a p-type graphene layer or an undoped graphene layer.

10. The sensing apparatus as recited in claim 1, further comprising a first protection layer covering the active device and the first electrode layer of the sensing device, wherein the first protection layer has a first opening exposing the first electrode layer, and the amorphous silicon layer fills into the first opening so as to be in contact with the first electrode layer.

11. The sensing apparatus as recited in claim 10, further comprising a second protection layer covering the first protection layer and the amorphous silicon layer, wherein the second protection layer has a second opening, and the second opening corresponds to the opening of the second electrode layer and exposes the amorphous silicon layer.

12. The sensing apparatus as recited in claim 11, wherein a thickness of the second protection layer is within a range from 500 angstroms to 15000 angstroms.

13. The sensing apparatus as recited in claim 10, further comprising a second protection layer covering the second electrode layer and the graphene layer, wherein the second protection layer has a contact window exposing the second electrode layer.

14. The sensing apparatus as recited in claim 13, further comprising a signal line electrically connected to the second electrode layer through the contact window.

15. The sensing apparatus as recited in claim 1, wherein the active device comprises:
   a gate, a gate insulation layer, and a channel layer, wherein the gate insulation layer is located between the gate and the channel layer, and the channel layer and the gate are at least partially overlapped in a vertical projection direction, and
   a source and a drain, the source and the drain being located at two sides of the channel layer, wherein the first electrode layer of the sensing device is electrically connected to the drain.

16. The sensing apparatus as recited in claim 15, further comprising a cover layer located above the channel layer.

* * * * *